(12) United States Patent
Dening et al.

(10) Patent No.: US 7,474,189 B1
(45) Date of Patent: Jan. 6, 2009

(54) CIRCUIT BOARD EMBEDDED INDUCTOR

(75) Inventors: David Dening, Stokesdale, NC (US); Steve Dorn, Eden, NC (US); Milind Shah, Greensboro, NC (US); Yang Rao, Colfax, NC (US); Michael Kay, Summerfield, NC (US); Jon Jorgenson, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 37 days.

(21) Appl. No.: 11/301,039

(22) Filed: Dec. 12, 2005

Related U.S. Application Data

(62) Division of application No. 11/089,297, filed on Mar. 24, 2005, now Pat. No. 6,996,892.

(51) Int. Cl.
*H01F 5/00* (2006.01)
(52) U.S. Cl. ........................................ 336/200
(58) Field of Classification Search ................ 336/65, 336/83, 200, 206–208, 232, 233; 257/531; 361/760–766
See application file for complete search history.

(56) References Cited

U.S. PATENT DOCUMENTS

| | | | | |
|---|---|---|---|---|
| 3,290,758 | A | 12/1966 | Moyer | 29/155.5 |
| 6,054,914 | A | 4/2000 | Abel et al. | 336/200 |
| 6,075,432 | A * | 6/2000 | Reymond | 336/200 |
| 6,198,374 | B1 | 3/2001 | Abel | 336/200 |
| 6,404,317 | B1 * | 6/2002 | Mizoguchi et al. | 336/200 |
| 6,614,093 | B2 | 9/2003 | Ott et al. | 257/531 |
| 2002/0013005 | A1 | 1/2002 | Rhee | 438/3 |
| 2002/0182374 | A1 | 12/2002 | Tung | 428/182 |
| 2003/0109118 | A1 | 6/2003 | Ott et al. | 438/531 |
| 2003/0112110 | A1 | 6/2003 | Pavier | 336/96 |
| 2004/0103522 | A1 | 6/2004 | Ahn et al. | 29/602.1 |
| 2005/0062575 | A1 * | 3/2005 | Gardner | 336/200 |
| 2006/0152323 | A1 * | 7/2006 | Pavier | 336/200 |

OTHER PUBLICATIONS

Hahn, Robert et al., "Design of Integrated Inductances Based on Ferromagnetic LTCC-Layers," 37th International Symposium on Electronics, IMAPS Nov. 2004.
Ludwig, Matthias et al., "PCB Integrated Inductors for Low Power DC/DC Converter," IEEE Transactions on Power Electronics, vol. 18, No. 4, Jul. 2003.
Park, Jae Y. et al., "Ferrite-Based Integrated Planar Inductors and Trnasformers Fabricated at Low Temperature," IEEE Transactions on Magnetics, vol. 33, No. 5, Sep. 1997.

* cited by examiner

*Primary Examiner*—Tuyen T. Nguyen
(74) *Attorney, Agent, or Firm*—Withrow & Terranova, PLLC

(57) ABSTRACT

A circuit board having an embedded inductor and a process for making the circuit board is provided. In general, the process begins by providing a core structure including a dielectric core layer and a first metal layer on a top surface of the dielectric core layer. The first metal layer is etched to form first inductor windings. A material, such as an epoxy material, including magnetic filler material is deposited over the first inductor windings. Thereafter, a prepreg layer is placed over and attached to the material deposited over the first inductor windings to form the circuit board having the embedded inductor.

6 Claims, 6 Drawing Sheets

CIRCUIT BOARD EMBEDDED INDUCTOR

CROSS-REFERENCE TO RELATED APPLICATIONS

This application is a Divisional of application Ser. No. 11/089,297, filed Mar. 24, 2005, currently pending, the disclosure of which is incorporated herein by reference in its entirety.

FIELD OF THE INVENTION

The present invention relates to circuit boards, and more particularly relates to a circuit board having an embedded inductor.

BACKGROUND OF THE INVENTION

Radio frequency (RF) power control in mobile terminals such as mobile telephones and the like may be implemented or augmented using a DC-DC converter, or switching power supply, to vary the voltage supplied to a power amplifier in the transmit chain of the mobile terminal in order to maintain high efficiency in the power amplifier. The costs associated with a state of the art switching power supply include input and output filter inductors, which can account for a large fraction of the total cost in the bill of materials. The application of this technology is further compounded by the physical size of the inductors, and the printed circuit board area that must be dedicated to the placement of the inductors. Accordingly, there remains a need for a low cost inductor requiring a minimum amount of area on the surface of the printed circuit board.

SUMMARY OF THE INVENTION

The present invention provides a method of manufacturing a circuit board having an embedded inductor. In general, the process begins by providing a core structure including a dielectric core layer and a first metal layer on a top surface of the dielectric core layer. The first metal layer is etched to form first inductor windings. A material, such as an epoxy material, including magnetic filler material is deposited over the first inductor windings. Thereafter, a preimpregnated material (prepreg) layer is placed over and attached to the material deposited over the first inductor windings.

In one embodiment, the core structure also includes a second metal layer on a bottom surface of the dielectric core layer. The second metal layer is etched to form second inductor windings. The material including the magnetic filler material is deposited over the second inductor windings, and a second prepreg layer is placed over and attached to the material including the magnetic filler material deposited over the second inductor windings.

In one embodiment, the first and second inductor windings are electronically coupled to form a single inductor. The first and second inductor windings may be coupled by a via filled with a conductive material and formed from an output of the first inductor windings to an input of the second inductor windings through the dielectric core layer. In this embodiment, the first and second inductor windings are etched such that a spiral pattern of the second inductor windings is a continuation of the spiral pattern of the first inductor windings.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1A:
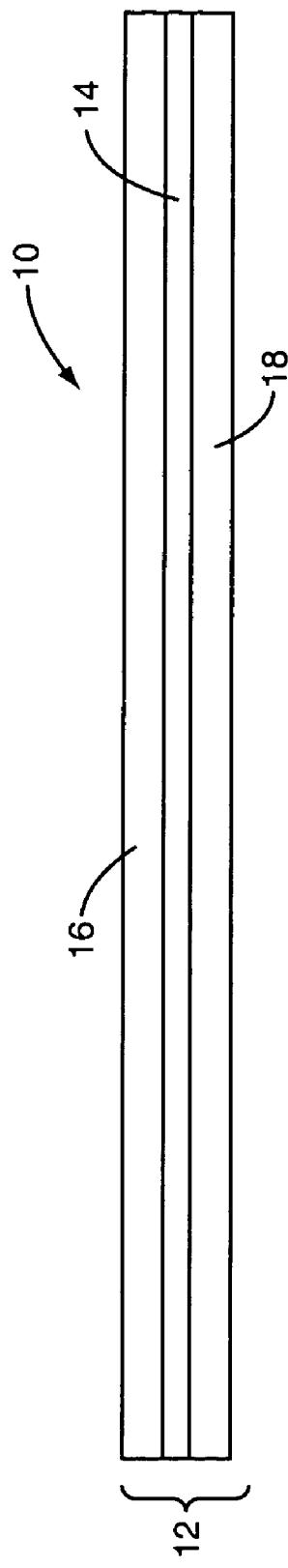
FIGS. 1A-1H illustrate phases in the manufacture of a circuit board having an embedded inductor according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

FIGS. 1A-1H illustrate a circuit board 10 including an inductor embedded within the circuit board 10 at sequential stages in during manufacture. Initially, the circuit board 10 begins as a core structure 12, which includes a dielectric core layer 14, a metal layer 16 on an upper surface of the dielectric core layer 14, and a metal layer 18 on a bottom surface of the dielectric core layer 14. The dielectric core layer 14 may be any dielectric material such as epoxy glass FR-4. The metal layers 16 and 18 may be any metal, such as, but not limited to, copper. In one embodiment, the dielectric core layer 14 is approximately 4 mils (milli-inches) thick, and the metal layers 16 and 18 are each approximately 4 mils thick. In one embodiment, the core structure 12 is essentially a thin printed circuit board (PCB) prior to etching.

Figure 1B:
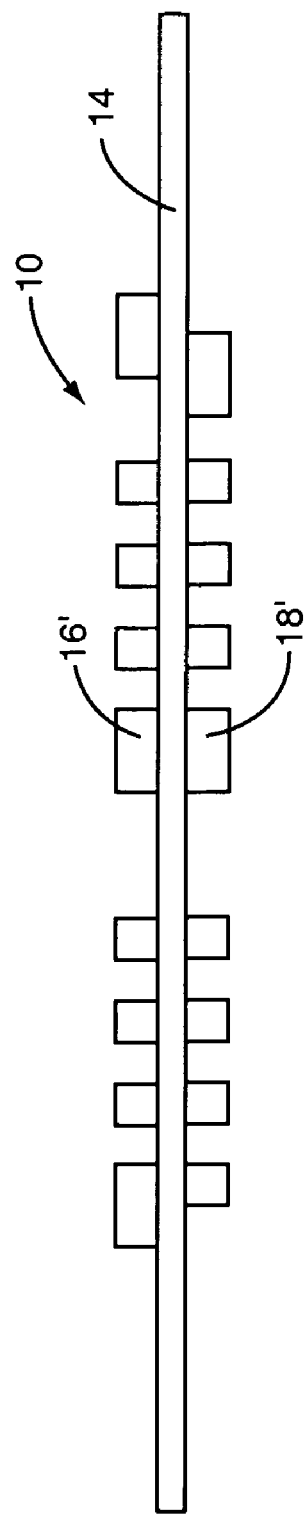

As illustrated in FIG. 1B, the metal layers 16 and 18 are then etched to form inductor windings 16' and 18' on both the top and bottom surfaces of the dielectric core layer 14. As will be apparent to one of ordinary skill in the art, the metal layers 16 and 18 may be etched by placing a photoresist layer on each of the metal layers 16 and 18, where the photoresist layers cover areas that are not to be removed by etching. More specifically, the photoresist layers cover areas of the metal layers 16 and 18 that are to be the inductor windings 16' and 18'. Thereafter, the metal layers 16 and 18 are etched to form the inductor windings 16' and 18', and the photoresist layer is removed to provide the circuit board 10 of FIG. 1B.

In one embodiment, the width and thickness of each winding of the inductor windings 16' and 18' are selected to provide the desired current and acceptable DC resistance. The desired current and acceptable DC resistance depend on the particular implementation. However, when used as an inductor for a switching power supply, increasing the width and decreasing the thickness of each winding reduces the number of turns of the inductor windings 16' and 18' and produces higher levels of eddy current losses at high switching frequencies.

Figure 1C:
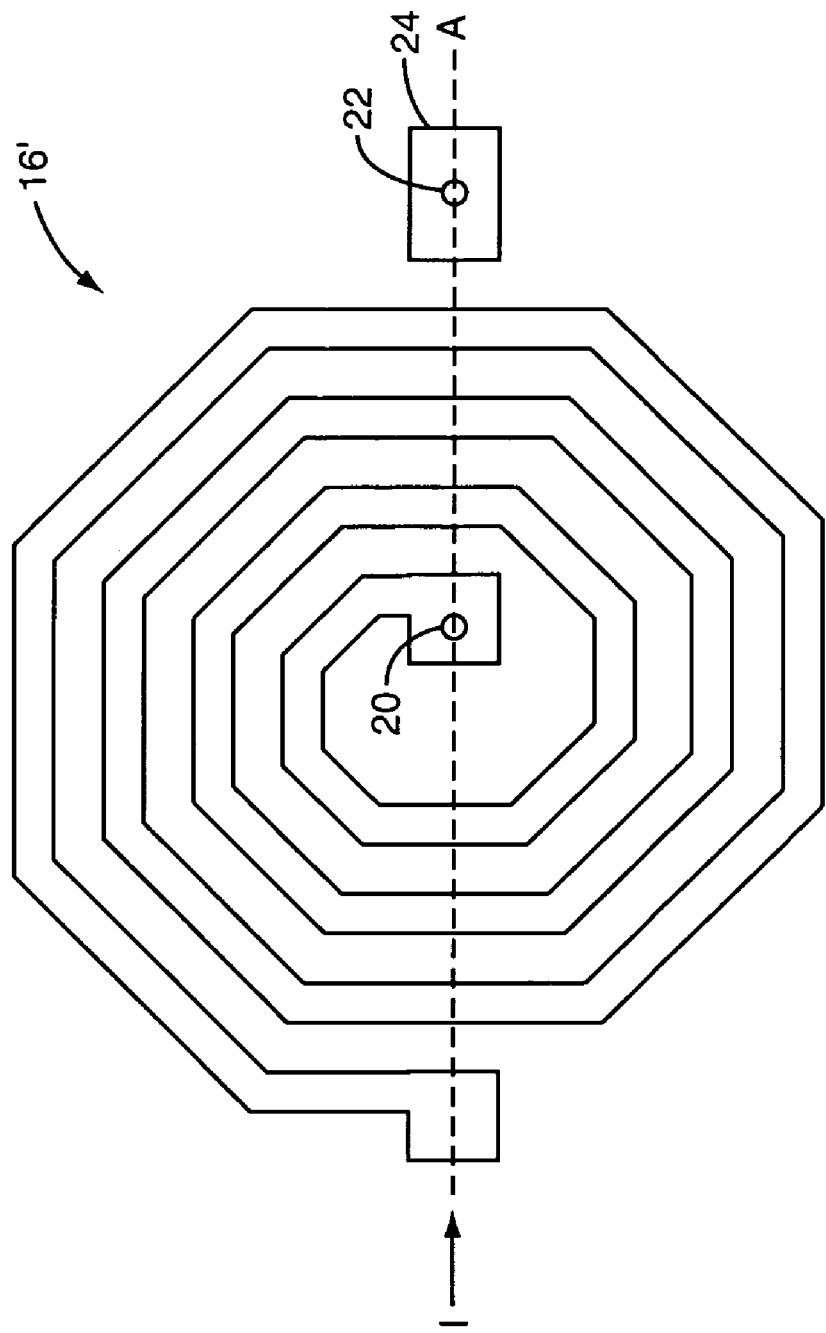

FIG. 1C is a top view of the inductor windings 16' of FIG. 1B. More specifically, FIG. 1C illustrates the inductor windings 16' formed by etching the metal layer 16. The polygonal shape of the inductor windings 16' is exemplary. The inductor windings 16' may be formed in any shape such as, but not limited to, circular, rectangular, square, and toroidal. Further, the number of windings of the inductor windings 16' may be any number depending on the particular implementation and the desired inductance. As discussed below, via 20 may be formed and filled with a conductive material, such as copper, to connect an output of the inductor windings 16' to an input of the inductor windings 18' (FIG. 1B). Via 22 is formed and filled with an electrically conductive material, such as copper, to connect output metal layer 24 to an output of the inductor windings 18'.

The inductor windings 16' and 18' are formed such that a spiral pattern of the inductor windings 18' are a continuation of the spiral pattern of the inductor windings 16'. In other words, the inductor windings 16' and 18' are formed such that current flow through the inductor windings 16' and 18' continues in a consistent direction. For example, if current (I) flows into the input of the inductor windings 16' as illustrated, the current (I) flows in a clock-wise direction through the inductor windings 16'. The inductor windings 18' are therefore formed such that the current (I) also flows in a clock-wise direction through the inductor windings 18'. Thus, the inductor windings 18' may be formed in a pattern equivalent to the pattern illustrated in FIG. 1C rotated 180 degrees about axis A.

By forming the inductor windings 16' and 18' as illustrated, the flux lines generated by current flowing through the inductor windings 16' and 18' couple and provide mutual inductance, thereby providing a higher inductance.

Figure 1D:
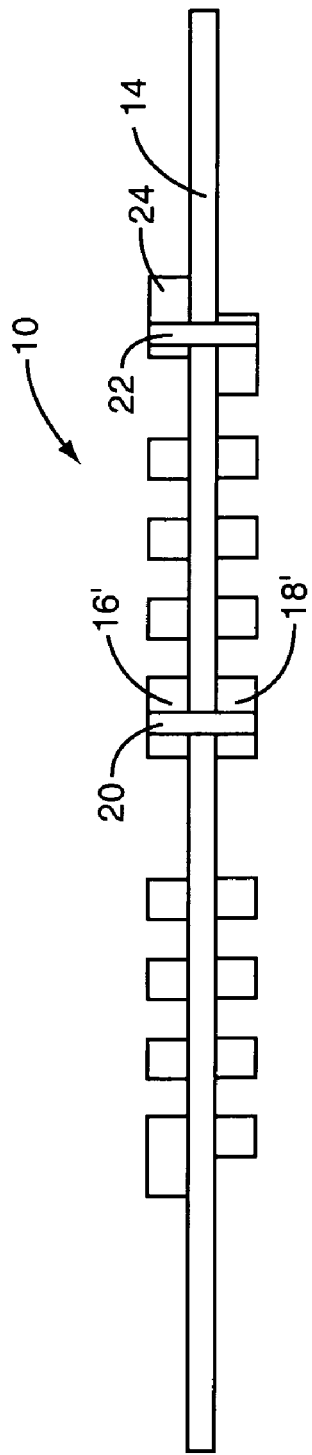

FIG. 1D is a cross-sectional view of the circuit board 10 illustrating the vias 20 and 22. The via 20 couples an output terminal of the inductor windings 16' to an input terminal of the inductor windings 18' such that the inductor windings 16' and 18' are coupled in series. The via 22 couples the output metal layer 24 to an output terminal of the inductor windings 18'. The vias 20 and 22 are filled with an electrically conductive material, such as copper, to provide an electrical interconnection.

Figure 1E:
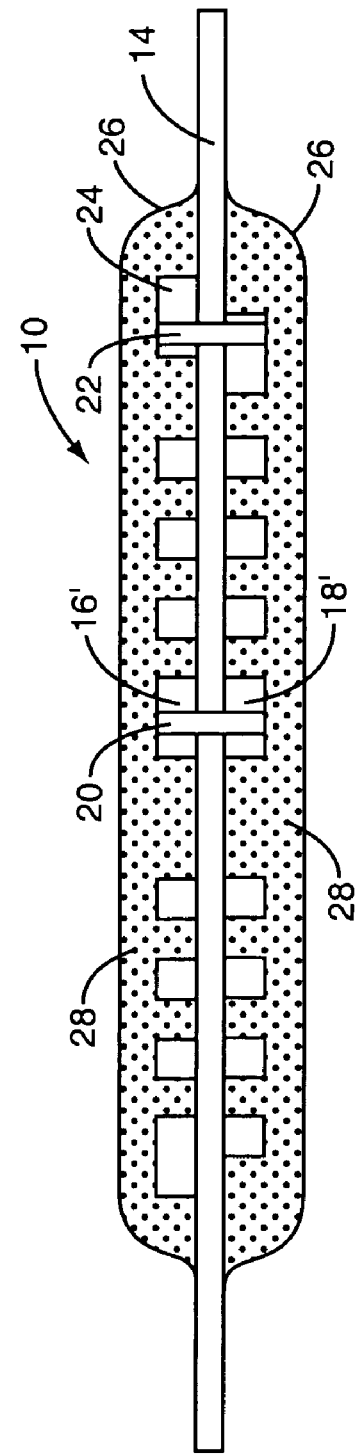

As illustrated in FIG. 1E, an epoxy material 26 including a ferrite filler material 28 is deposited over the inductor windings 16' and 18'. In one embodiment, the epoxy material 26 is deposited by screening. The epoxy material 26 is exemplary. Any material capable of carrying the ferrite filler material 28 and encapsulating the inductor windings 16' and 18' may alternatively be used. The ferrite filler material 28 may be a ferrite powder where each grain of the ferrite filler material 28 has an arbitrary shape. In one embodiment, each grain of the ferrite filler material 28 has a sub-micron diameter, such as a 10 micrometer diameter. The ferrite filler material 28, which is a magnetic material, concentrates the magnetic flux lines created by current flow through the inductor windings 16' and 18' and increases the inductance of the inductor formed by the inductor windings 16' and 18'. For example, the epoxy material 26 including the ferrite filler material 28 may have an effective permeability, which is the ratio of the permeability of the epoxy material 26 including the ferrite filler material 28 to the permeability of the epoxy material 26 without the ferrite filler material 28, equal to or greater than three such that the inductance of the inductor windings 16' and 18' increases to at least three times the inductance of the inductor windings 16' and 18' without the ferrite filler material 28.

Figure 1F:
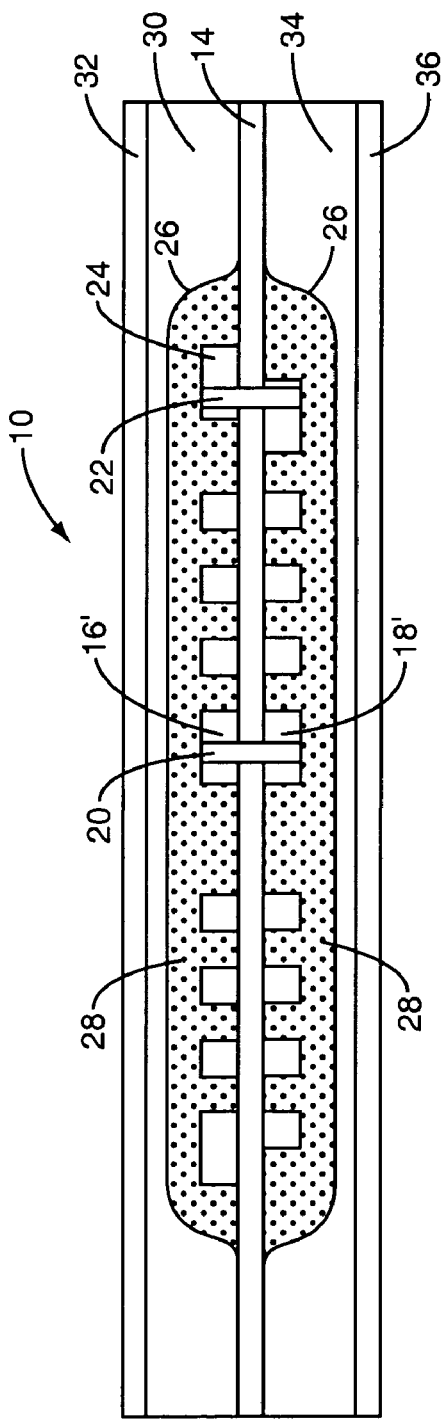

After depositing epoxy material 26 including the ferrite filler material 28, standard printed circuit board (PCB) procedures are employed to build the desired substrate. As illustrated in FIG. 1F, a preimpregnated material (prepreg) layer 30 and a metal layer 32, such as a copper metal layer, are placed over the inductor windings 16', and a prepreg layer 34 and metal layer 36, such as a copper metal layer, are placed over the inductor windings 18'. The prepreg layers 30 and 34 having the metal layers 32 and 36 are commercially available and are selected based on processing requirements and board specifications, which may vary depending on the particular implementation. The prepreg layers 30 and 34 consist of a fiber or fiber sheet material, such as glass or carbon, that are "preimpregnated" with thermoset or thermoplastic organic resin matrices. An exemplary thermoset is epoxy. The resin is not completely cured but is partially polymerized (a B-stage cure).

As will be apparent to one of ordinary skill in the art, the prepreg layers 30 and 34 are placed over the epoxy material 26, and the metal layers 32 and 36 are placed on the prepreg layers 30 and 34, respectively, as illustrated. The metal layers 32 and 36 are laminated to the prepreg layers 30 and 34, and the prepreg layers 30 and 34 are laminated to the dielectric core layer 14 and the epoxy material 26 using a standard lamination procedure where the circuit board 10 is subjected to a temperature, such as 150 degrees Celsius, and a pressure, such as 100-200 PSI. As a result of the pressure and temperature, the partially polymerized resin within the prepreg layers 30 and 34 polymerizes, flows, and assumes a conformal covering over epoxy material 26, thereby attaching the metal layers 32 and 36 to the prepreg layers 30 and 34, and attaching the prepreg layers 30 and 34 to the dielectric core layer 14 and the epoxy material 26.

Figure 1G:
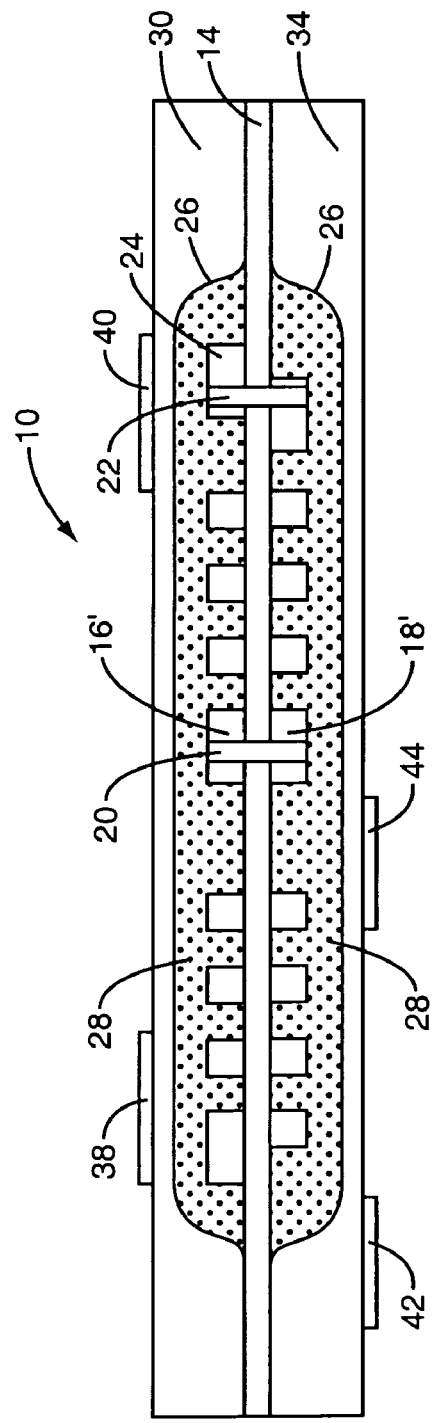

As illustrated in FIG. 1G, the metal layer 32 is then etched to form contact pads 38 and 40. The metal layer 36 may also be etched to form contact pads 42 and 44, although, for the illustrated embodiment, the contact pads 42 and 44 are not necessary.

Figure 1H:
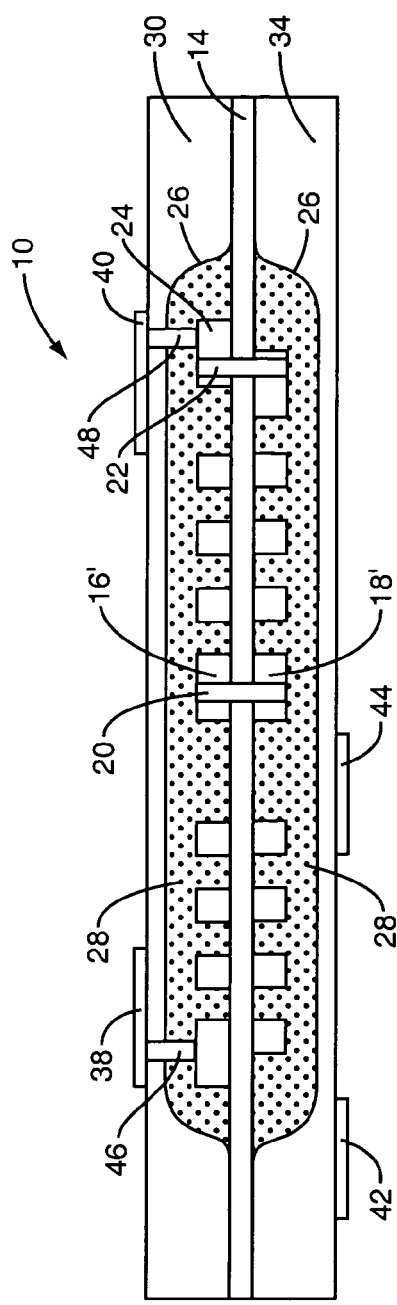

Vias 46 and 48 are formed and filled with a conductive material such as copper, as illustrated in FIG. 1H. The via 46 couples the contact pad 38 to an input of the inductor windings 16'. The via 48 couples the contact pad 40 to the output metal layer 24, and thus the output of the inductor windings 18'. As such, the contact pads 38 and 40 operate as input and output terminals of the inductor formed by the inductor windings 16' and 18'.

FIGS. 1A-1H illustrate the circuit board 10 having inductor windings 16' and 18'. However, in another embodiment, only one of the inductor windings 16' and 18' may be formed. In another embodiment, the inductor windings 16' and 18' may not be coupled by the via 20 such that the inductor windings 16' and 18' form separate inductors, as will be apparent to one of ordinary skill in the art upon reading this disclosure. Also, the epoxy material 26 is illustrated in FIGS. 1E-1H as covering only the inductor windings 16' and 18' such that there is an exposed portion of the dielectric core layer 14 surrounding the epoxy material 26. In another embodiment, the epoxy material 26 may cover the entire top and bottom surfaces of the dielectric core layer 14 including the inductor windings 16' and 18' such that the prepreg layers 30 and 34 are attached to only the epoxy material 26 rather than to both the epoxy material 26 and exposed portions of the dielectric core layer 14 as illustrated.

Figure 2:
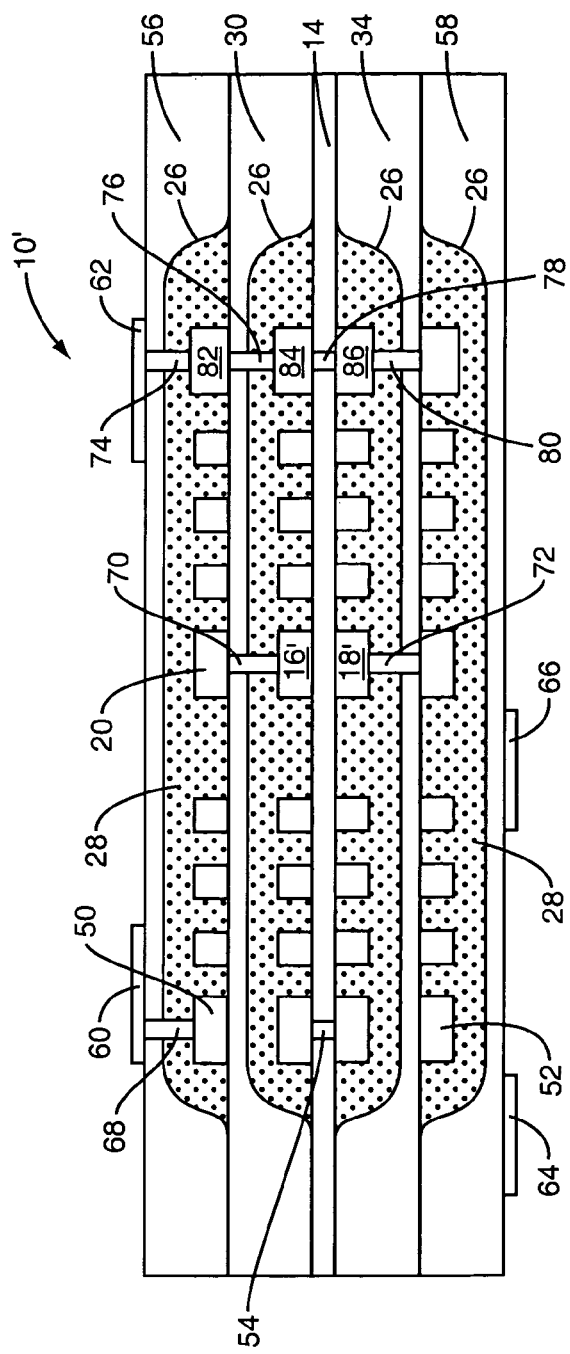
FIG. 2 illustrates a circuit board having an embedded inductor according to a second embodiment of the present invention.

FIG. 2 illustrates a circuit board 10' including four inductor windings according to another embodiment of the present invention. More specifically, the circuit board 10' includes the inductor windings 16' and 18', as described above, and inductor windings 50 and 52. The dielectric core layer 14, the inductor windings 16' and 18', the epoxy material 26 including the ferrite filler material 28, and the prepreg layers 30 and 34 are formed as described above. However, in this embodiment, the inductor windings 16' and 18' are connected by via 54 rather than via 20. The inductor windings 50 and 52 are formed by etching the metal layers 32 and 36 (FIG. 1F). Thereafter, the epoxy material 26 including the ferrite filler material 28 is deposited on the inductor windings 50 and 52. Prepreg layers 56 and 58 are laminated on the epoxy material 28 and the prepreg layers 30 and 34, respectively, and associated metal layers are etched to form contact pads 60-66.

The contact pad 60 is coupled to an input of the inductor windings 50 by a via 68 filled with a conductive material, such as copper. An output of the inductor windings 50 is coupled to an input of the inductor windings 16' by via 70 filled with a conductive material. An output of the inductor windings 16' is coupled to an input of the inductor windings 18' by the via 54 filled with conductive material, and an output of the inductor windings 18' is coupled to an input of the inductor windings 52 by via 72 filled with conductive material. The contact pad 62 is coupled to the output of the inductor windings 52 by vias 74-80 and metal layers 82-86, as illustrated. The vias 74-80 are filled with a conductive material, such as copper. Note that the metal layers 82-86 are not part of the inductor windings 50, 16', and 18', respectively. Rather, the metal layers 82-86 are similar to the output metal layer 24 (FIG. 1C).

The inductor windings 50, 16', 18' and 52 are formed such that a spiral pattern of the inductor windings 16', 18' and 52 are a continuation of the spiral pattern of the inductor windings 50. In other words, the inductor windings 50, 16', 18' and 52 are formed such that current flow through the inductor windings 50, 16', 18' and 52 continues in a consistent direction. For example, if current flows into the input of the inductor windings 50 through the contact pad 60, the current flows in a clock-wise direction through the inductor windings 50, assuming the inductor windings 50 are formed in a pattern similar to that of FIG. 1C. The inductor windings 16', 18' and 52 are formed such that the current also flows in a clock-wise direction through each of the inductor windings 16', 18' and 52.

Figure 3:
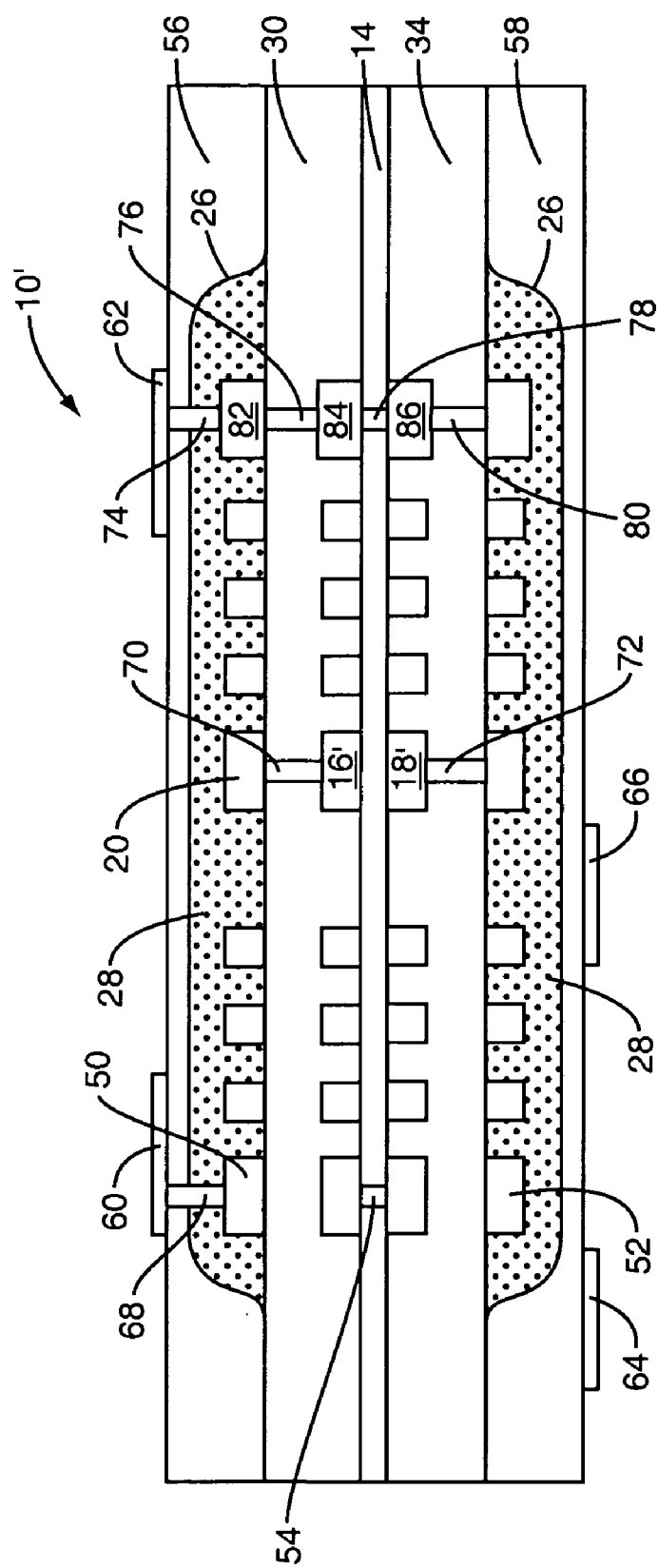
FIG. 3 illustrates a circuit board having an embedded inductor according to another embodiment of the present invention.

FIG. 3 illustrates a circuit board 10' including four inductor windings according to another embodiment of the present invention. This embodiment is substantially the same as the embodiment in FIG. 2 except that the epoxy material 26 including the ferrite filler material 28 is not deposited over the inductor windings 16' and 18'. In this embodiment, the epoxy material 26 including the ferrite filler material 28 is only deposited over the inductor windings 50 and 52.

Those skilled in the art will recognize improvements and modifications to the preferred embodiments of the present invention. All such improvements and modifications are considered within the scope of the concepts disclosed herein and the claims that follow.

What is claimed is:

1. A circuit board having an embedded inductor comprising:
   a core structure comprising a dielectric core layer and a first metal layer on a top surface of the dielectric core layer, the first metal layer etched to form first inductor windings;
   a material including a magnetic filler material deposited over the first inductor windings;
   a first prepreg layer attached to a top surface of the material, wherein the core structure further comprises a second metal layer on a bottom surface of the dielectric core layer, the second metal layer etched to form second inductor windings, the circuit board further comprising:
   a material including magnetic filler material deposited over the second inductor windings; and
   a second prepreg layer attached to a top surface of the material including the magnetic filler material deposited over the second inductor windings.

2. The circuit board of claim 1 further comprising a material including a magnetic filler material deposited over a bottom surface of the dielectric core layer to provide a magnetic path surrounding the first inductor windings.

3. The circuit board of claim 1 wherein the first inductor windings are electrically coupled to the second inductor windings such that the first and second inductor windings form an inductor.

4. The circuit board of claim 3 further comprising a via filled with electrically conductive material coupling an output of the first inductor windings to an input of the second inductor windings.

5. The circuit board of claim 3 wherein a spiral pattern of the second inductor windings is a continuation of a spiral pattern of the first inductor windings.

6. The circuit board of claim 1, wherein the magnetic filler material encapsulates the first inductor windings.

* * * * *